(12) United States Patent
Liu et al.

(10) Patent No.: US 12,387,932 B2
(45) Date of Patent: Aug. 12, 2025

(54) METHOD FOR FORMING ACTIVE AREA AND METHOD FOR FORMING SEMICONDUCTOR STRUCTURE

(71) Applicant: CHANGXIN MEMORY TECHNOLOGIES, INC., Hefei (CN)

(72) Inventors: Yang Liu, Hefei (CN); Wei Wan, Hefei (CN); Pan Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 657 days.

(21) Appl. No.: 17/660,125

(22) Filed: Apr. 21, 2022

(65) Prior Publication Data

US 2023/0122738 A1 Apr. 20, 2023

(30) Foreign Application Priority Data

Oct. 15, 2021 (CN) .......................... 202111202479.3

(51) Int. Cl.
*H01L 21/033* (2006.01)
*H01L 21/308* (2006.01)
*H01L 21/311* (2006.01)
*H01L 21/768* (2006.01)

(52) U.S. Cl.
CPC ...... *H01L 21/0332* (2013.01); *H01L 21/3081* (2013.01); *H01L 21/31144* (2013.01); *H01L 21/768* (2013.01)

(58) Field of Classification Search
CPC .......... H01L 21/0332; H01L 21/31144; H01L 21/768; H01L 21/3086; H10B 12/05; H10B 12/482; H10B 12/488
See application file for complete search history.

(56) References Cited

U.S. PATENT DOCUMENTS 7,202,174 B1 * 4/2007 Jung ...................... H10B 41/49
257/E21.314

FOREIGN PATENT DOCUMENTS

CN 102208330 A 10/2011
CN 103715080 B 8/2016

* cited by examiner

*Primary Examiner* — Su C Kim
(74) *Attorney, Agent, or Firm* — Syncoda LLC; Feng Ma (57) ABSTRACT

A method for forming the active area includes the following operations. A semiconductor substrate is provided. A first mask layer and a second mask layer are sequentially formed on a surface of the semiconductor substrate, in which the second mask layer has an initial pattern for forming the active area. A sacrificial layer covering the second mask layer is formed. The sacrificial layer and a portion of the second mask layer are removed to form a third mask layer with a preset thickness, in which the preset thickness is less than an initial thickness of the second mask layer. The active area is formed through the third mask layer and the first mask layer.

13 Claims, 10 Drawing Sheets

METHOD FOR FORMING ACTIVE AREA AND METHOD FOR FORMING SEMICONDUCTOR STRUCTURE

CROSS-REFERENCE TO RELATED APPLICATION

The present application claims priority to Chinese Patent Application No. 202111202479.3 filed on Oct. 15, 2021, the disclosure of which is hereby incorporated by reference in its entirety.

BACKGROUND

A Dynamic Random Access Memory (DRAM) is a semiconductor memory widely used in electronic products, such as a mobile phone, a computer, and an automobile. With the development of science and technology, the feature size of an integrated circuit device is continuously decreasing, the key size of the DRAM is also becoming smaller and smaller, and the preparation difficulty is becoming larger and larger.

SUMMARY

The disclosure relates to the technical field of semiconductors, and relates, but is not limited, to a method for forming an active area and a method for forming a semiconductor structure.

In view of this, embodiments of the disclosure provide a method for forming an active area and a method for forming a semiconductor structure.

In a first aspect, an embodiment of the disclosure provides a method for forming an active area, which includes the following operations.

A semiconductor substrate is provided.

A first mask layer and a second mask layer are sequentially formed on a surface of the semiconductor substrate. The second mask layer has an initial pattern for forming the active area.

A sacrificial layer covering the second mask layer is formed.

The sacrificial layer and a portion of the second mask layer are removed to form a third mask layer with a preset thickness. The preset thickness is less than an initial thickness of the second mask layer.

The active area is formed through the third mask layer and the first mask layer.

In a second aspect, an embodiment of the disclosure provides a method for forming a semiconductor structure, which includes the following operations.

A semiconductor substrate is provided.

An active area is formed on the semiconductor substrate.

Word lines are formed. The word lines intersect with the active area in a word line extension direction.

Bit lines are formed. The bit lines intersect with the active area in a bit line extension direction.

The operation that the active area is formed on the semiconductor substrate includes the following operations.

The semiconductor substrate is provided.

A first mask layer and a second mask layer are sequentially formed on a surface of the semiconductor substrate. The second mask layer has an initial pattern for forming the active area.

A sacrificial layer covering the second mask layer is formed.

The sacrificial layer and a portion of the second mask layer are removed to form a third mask layer with a preset thickness. The preset thickness is less than an initial thickness of the second mask layer.

The active area is formed through the third mask layer and the first mask layer.

BRIEF DESCRIPTION OF THE DRAWINGS

In the accompanying drawings (which are not necessarily drawn to scale), similar reference numerals may denote similar components in different diagrams. The similar reference numerals having different letter suffixes may denote different examples of the similar components. The accompanying drawings generally illustrate various embodiments discussed in the disclosure by way of example and not by way of limitation.

DESCRIPTION OF REFERENCE NUMERALS

100/200—semiconductor substrate; 101—first hard mask layer; 102—second hard mask layer; 103—photoresist layer; 102a—etched second hard mask layer; 106—spacer layer; 104—third hard mask layer; 201—first mask layer; 201a—first layer of first mask layer; 201b—second layer of first mask layer; 201c—third layer of first mask layer; 201d—fourth layer of first mask layer; 201e—barrier layer; 202'—second initial mask layer; 203—patterned photoresist layer; 202a'—first initial hard mask layer; 202b'—second initial hard mask layer; 202c'—initial anti-reflection layer; 202—second mask layer; 202a—first hard mask layer; 202b—second hard mask layer; 202c—anti-reflection layer; 204—sacrificial layer; 204'—sacrificial layer with preset thickness; 206—first spacer material layer; 207—second spacer material layer; 207'—remaining portion of second spacer material layer; 206a—vertical spacer; 206b—horizontal spacer; 208—fourth mask layer; 201'—patterned first mask layer; 201a'—patterned first layer of first mask layer; 201b'—patterned second layer of first mask layer; 201c'—patterned third layer of first mask layer; 201d'—patterned fourth layer of first mask layer; 201e'—patterned barrier layer; 209—active area; 210—shallow trench isolation; 50—semiconductor structure; 501—bit line; 502—word line; A—intermediate pattern; B—initial pattern; C—preset pattern.

DETAILED DESCRIPTION

Exemplary embodiments of the disclosure will be described in more detail below with reference to the accompanying drawings. Although the exemplary embodiments of the disclosure are shown in the accompanying drawings, it should be understood that the disclosure can be implemented in various forms and cannot be limited by the embodiments illustrated herein. On the contrary, these embodiments are provided to more thoroughly understand the disclosure and to completely convey the scope of the disclosure to those skilled in the art.

In the following description, numerous specific details are set forth in order to provide a more thorough understanding of the disclosure. However, it will be apparent to those skilled in the art that the disclosure can be implemented without one or more of these details. In other examples, in order to avoid confusion with the disclosure, some technical features known in the art are not described. That is, all the features of the actual embodiments are not described here, and the well-known functions and structures are not described in detail.

In the accompanying drawings, the sizes and relative size of layers, regions, and elements may be exaggerated for clarity. The same reference numerals denote the same elements from beginning to end.

It should be understood that, when an element or layer is described as being "on", "adjacent to", "connected to" or "coupled to" another element or layer, it can be directly on, adjacent to, connected to, or coupled to the other element or layer, or there can be an intermediate element or layer. In contrast, when an element is described as being "directly on", "directly adjacent to", "directly connected to" or "directly coupled to" another element or layer, there are no intermediate element or layer. It should be understood that although the terms "first", "second", "third" and so on may be used to describe various elements, components, regions, layers, and/or portions, these elements, components, regions, layers, and/or portions should not be limited by these terms. These terms are used merely to distinguish an element, component, region, layer, or portion from another element, component, region, layer, or portion. Therefore, a first element, component, region, layer, or portion discussed below may be described as a second element, component, region, layer, or portion without departing from the teachings of the disclosure. When the second element, component, region, layer or portion is discussed, it does not mean that the first element, component, region, layer or portion is necessarily present in the disclosure.

Terms used herein are for the purpose of describing specific embodiments only and are not intended to be limiting of the disclosure. As used herein, "a/an", "one", and "the" in singular forms are also intended to include a plural form unless the context clearly indicates other forms. It should also be understood that the terms "consist" and/or "include" when used in the description, determine presence of the features, integers, steps, operations, elements, and/or components, but do not exclude the presence or addition of one or more other features, integers, steps, operations, elements, components, and/or groups. As used herein, the term "and/or" includes any and all combinations of the related listed items.

In some implementations, in a process of etching an Active Area (AA) of the DRAM, since a Double Pattern process is used, a line width becomes smaller, so that adverse effects, such as pattern deformation, are easily caused, which is not conducive to the subsequence formation of the active area.

Before describing the method for forming the active area in the embodiment of the disclosure in detail, the method for forming the active area in some implementations is firstly described.

Figure 1A:
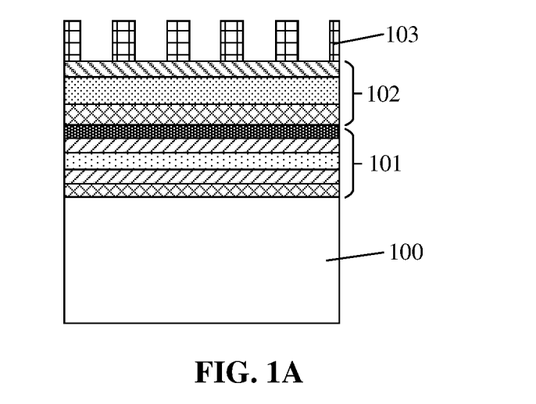
FIG. 1A is a first schematic diagram showing a forming process of an active area in some implementations.
Figure 1B:
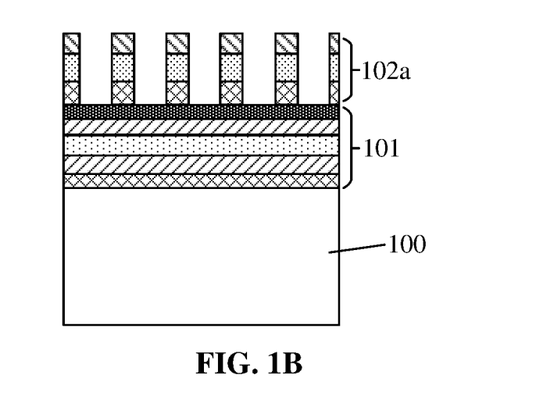
FIG. 1B is a second schematic diagram showing a forming process of an active area in some implementations.
Figure 1C:
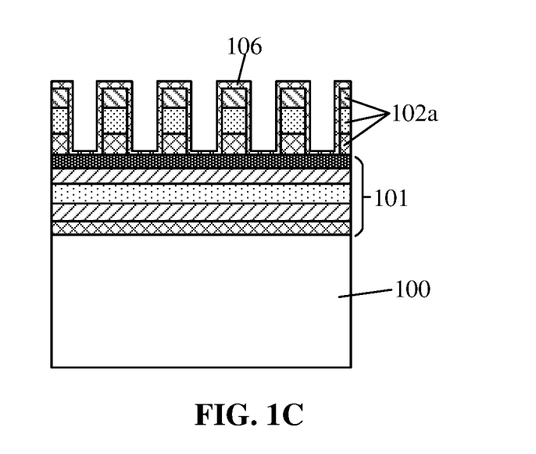
FIG. 1C is a third schematic diagram showing a forming process of an active area in some implementations.
Figure 1D:
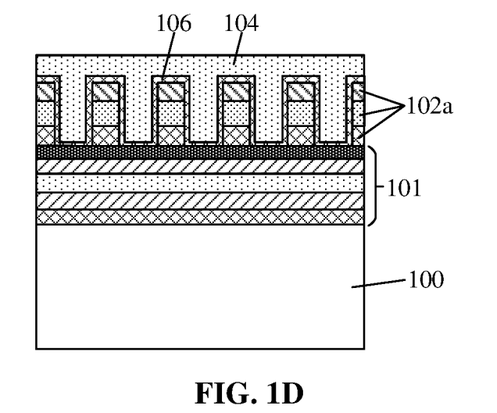
FIG. 1D is a fourth schematic diagram showing a forming process of an active area in some implementations.
Figure 1E:
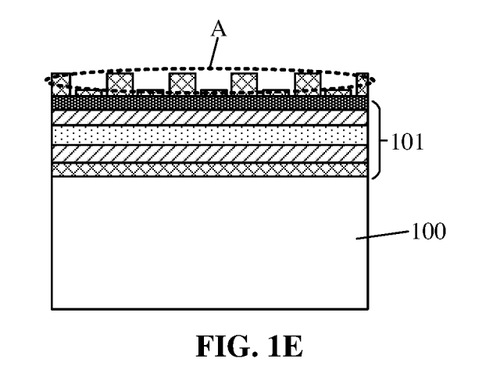
FIG. 1E is a fifth schematic diagram showing a forming process of an active area in some implementations.

FIG. 1A to FIG. 1E are schematic diagrams showing a forming process of an active area in some implementations. As shown in FIG. 1A to FIG. 1E, the forming process of the active area in some implementations includes the following operations. Firstly, as shown in FIG. 1A, a first hard mask layer 101 and a second hard mask layer 102 are formed on a surface of a semiconductor substrate 100, and a photoresist layer 103 is formed on a surface of the second hard mask layer 102. The photoresist layer 103 has an initial pattern for forming the active area. Secondly, a first etching process is performed. As shown in FIG. 1B, the second hard mask layer 102 is etched through the photoresist layer 103, so as to obtain an etched second hard mask layer 102a. The etched second hard mask layer 102a exposes a portion of a surface of the first hard mask layer 101. Thirdly, as shown in FIG. 1C, a spacer layer 106 is formed on an exposed portion of the surface of the first hard mask layer 101 and a top portion and sidewalls of the etched second hard mask layer 102a. In addition, as shown in FIG. 1D, a third hard mask layer 104 is formed on a surface of the spacer layer 106, and the third hard mask layer 104 and a portion of the spacer layer 106 are etched, so as to form an intermediate pattern A as shown in FIG. 1E. Finally, a second etching process and a third etching process are performed, in which the first hard mask layer 101 and the semiconductor substrate 100 are etched through the intermediate pattern A, so as to form a plurality of active areas and shallow trench isolation structures spaced from each other in the semiconductor substrate 100.

In some implementations, after the first etching through a Double Pattern process, a layer of spacer layer 106 (such as silicon oxide) may be deposited on a surface of the etched second hard mask layer 102a. Since the height of the etched second hard mask layer 102a is relatively high in some implementations, it is difficult to control the deposited surface, and it is thus difficult to control the shape of the patterns in the subsequent second etching process and third etching process, which is not conductive to the subsequent formation of the active area.

Based on the above-mentioned problems in some implementations, the embodiments of the disclosure provide a method for forming an active area and a method for forming a semiconductor structure. The method for forming the active area includes the following operations. A semiconductor substrate is provided. A first mask layer and a second mask layer are sequentially formed on a surface of the semiconductor substrate, in which the second mask layer has an initial pattern for forming the active area. A sacrificial layer covering the second mask layer is formed. The sacrificial layer and a portion of the second mask layer are removed to form a third mask layer with a preset thickness, in which the preset thickness is less than an initial thickness of the second mask layer. The active area is formed through the third mask layer and the first mask layer. In the embodiments of the disclosure, the third mask layer with a relatively small thickness is obtained by processing the second mask layer with the initial pattern for forming the active area, so as to form the active area through the third mask layer, so that the shape of the pattern in the subsequent etching process can be easily controlled, which is conducive to the formation of the active area.

Figure 2:
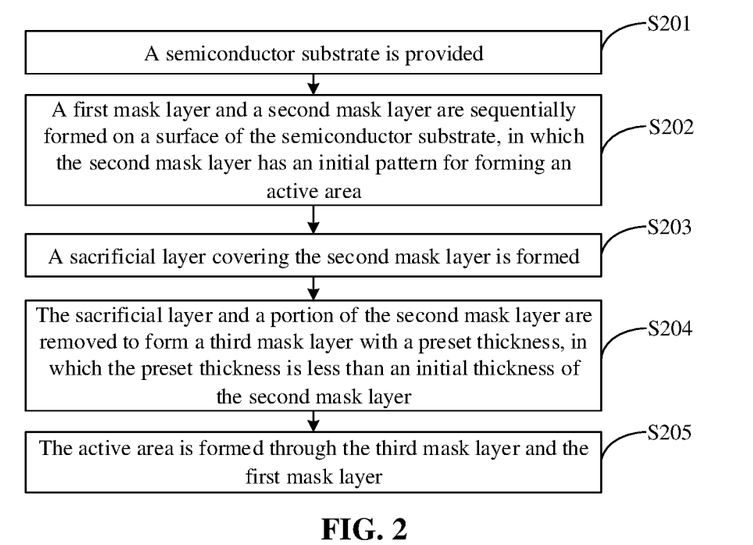
FIG. 2 is a schematic flowchart of a method for forming an active area according to an embodiment of the disclosure.

The embodiment of the disclosure provides a method for forming an active area. FIG. 2 is a schematic flowchart of a method for forming an active area according to an embodiment of the disclosure. As shown in FIG. 2, the method for forming the active area includes the following operations.

In S201, a semiconductor substrate is provided.

In the embodiment of the disclosure, the semiconductor substrate may be a silicon substrate. The semiconductor substrate may also include other semiconductor elements, such as germanium (Ge), or may include semiconductor compounds, such as silicon carbide (SiC), gallium arsenide (GaAs), gallium phosphide (GaP), indium phosphide (InP), indium arsenide (InAs) or indium antimonide (InSb), or may include other semiconductor alloys, such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP) and/or phosphorus gallium indium arsenide (GaInAsP), or a combination thereof.

In S202, a first mask layer and a second mask layer are sequentially formed on a surface of the semiconductor substrate. The second mask layer has an initial pattern for forming the active area.

In the embodiment of the disclosure, the first mask layer and the second mask layer may be sequentially formed on the surface of the semiconductor substrate through any suitable deposition process, such as a Chemical Vapor Deposition (CVD) process, a Physical Vapor Deposition (PVD) process, an Atomic Layer Deposition (ALD) process, a spin coating process, or a coating process.

The first mask layer or the second mask layer may be composed of one mask layer, or may also be composed of multiple mask layers.

In S203, a sacrificial layer covering the second mask layer is formed.

In the embodiment of the disclosure, the second mask layer has an initial pattern for forming the active area. Thus, the second mask layer exposes a portion of the surface of the first mask layer, and the sacrificial layer covers the surface of the second mask layer. Therefore, the sacrificial layer also covers a portion of the surface of the first mask layer. The sacrificial layer may be composed of any material which is easier to remove than the second mask layer or the first mask layer.

In S204, the sacrificial layer and a portion of the second mask layer are removed to form a third mask layer with a preset thickness. The preset thickness is less than an initial thickness of the second mask layer.

Herein, a process of removing the sacrificial layer and the portion of the second mask layer may be an etching removal process, or may also be a Chemical Mechanical Polishing (CMP) removal process. In the embodiment of the disclosure, the method for removing the sacrificial layer and the portion of the second mask layer is not limited.

In the embodiment of the disclosure, compared with the second mask layer, the third mask layer only has a reduced thickness. The third mask layer also has the initial pattern for forming the active area.

In S205, the active area is formed through the third mask layer and the first mask layer.

Figure 3A:
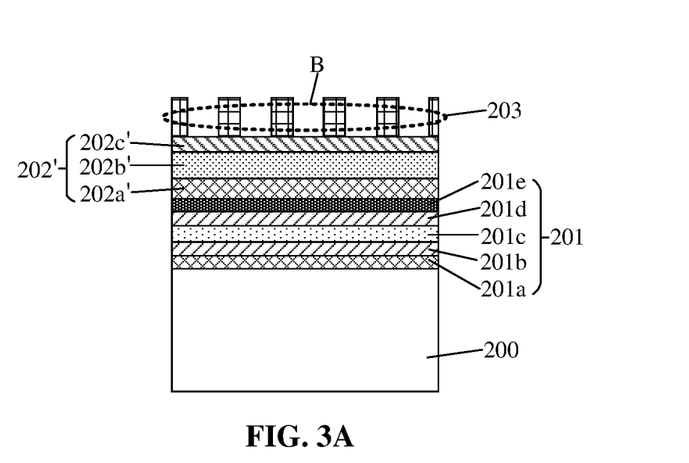
FIG. 3A is a first schematic diagram showing a forming process of an active area according to an embodiment of the disclosure.
Figure 3B:
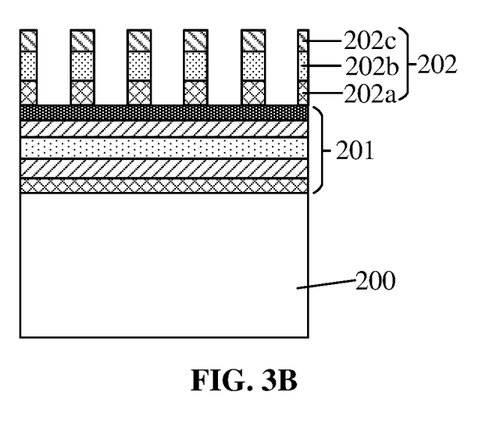
FIG. 3B is a second schematic diagram showing a forming process of an active area according to an embodiment of the disclosure.
Figure 3C:
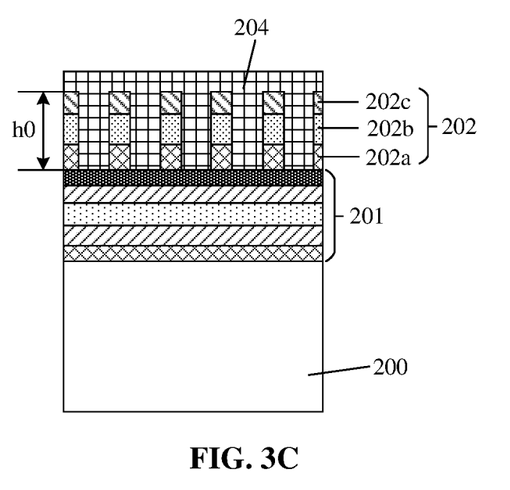
FIG. 3C is a third schematic diagram showing a forming process of an active area according to an embodiment of the disclosure.
Figure 3D:
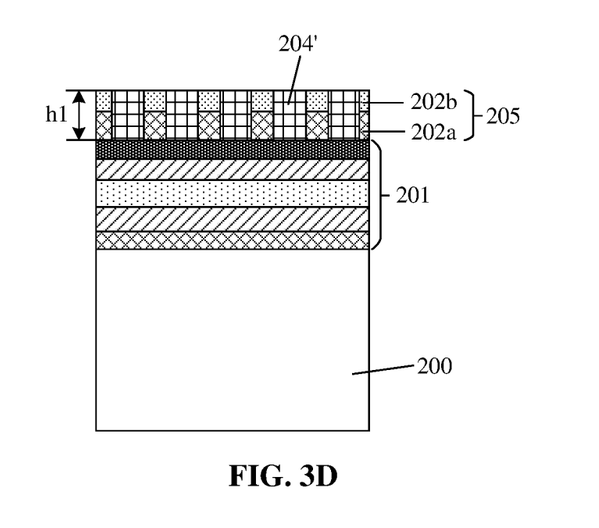
FIG. 3D is a fourth schematic diagram showing a forming process of an active area according to an embodiment of the disclosure.
Figure 3E:
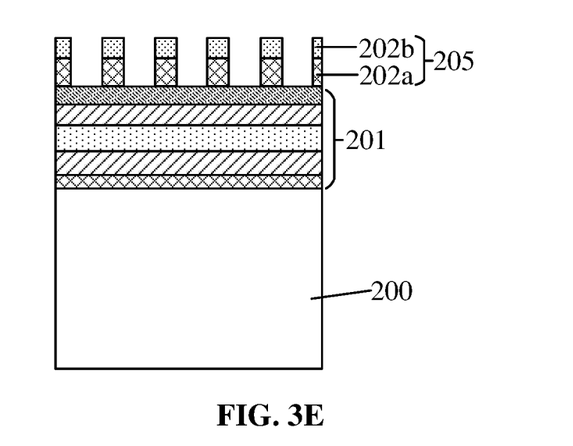
FIG. 3E is a fifth schematic diagram showing a forming process of an active area according to an embodiment of the disclosure.
Figure 3F:
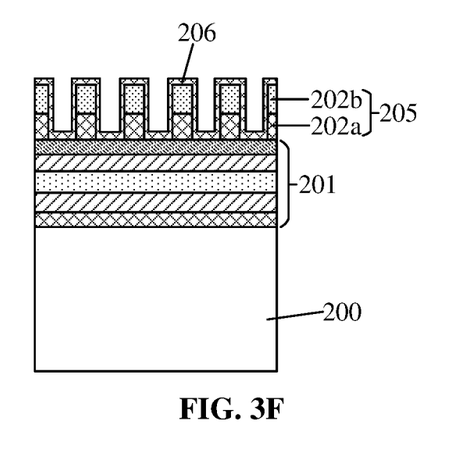
FIG. 3F is a sixth schematic diagram showing a forming process of an active area according to an embodiment of the disclosure.
Figure 3G:
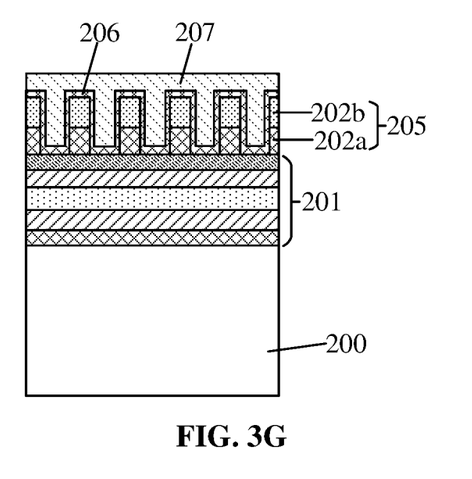
FIG. 3G is a seventh schematic diagram showing a forming process of an active area according to an embodiment of the disclosure.
Figure 3H:
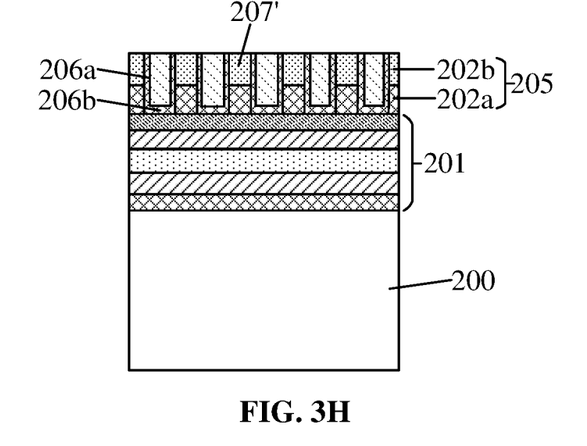
FIG. 3H is an eighth schematic diagram showing a forming process of an active area according to an embodiment of the disclosure.
Figure 3I:
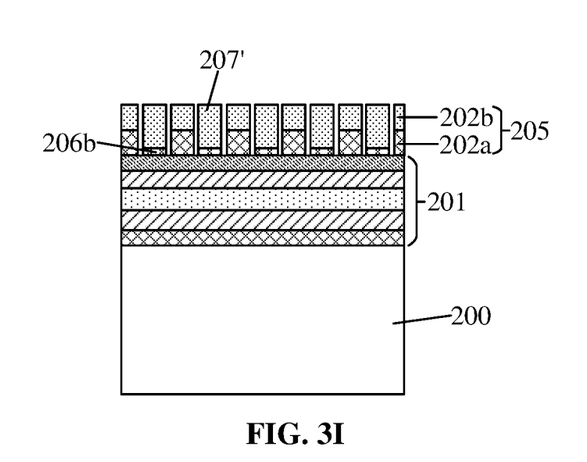
FIG. 3I is a ninth schematic diagram showing a forming process of an active area according to an embodiment of the disclosure.
Figure 3J:
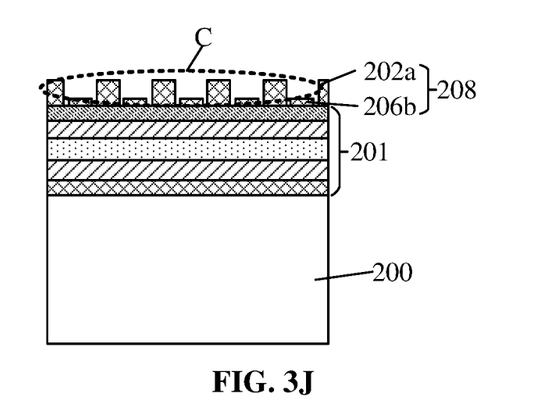
FIG. 3J is a tenth schematic diagram showing a forming process of an active area according to an embodiment of the disclosure.
Figure 3K:
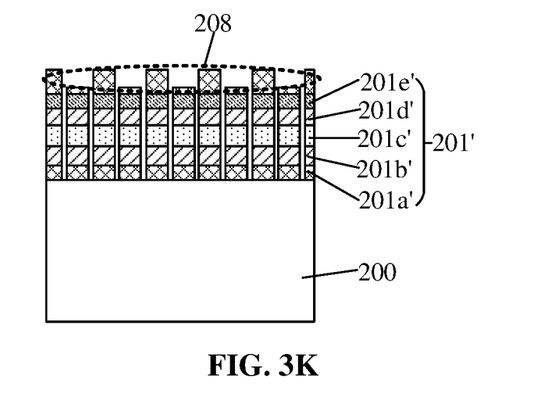
FIG. 3K is an eleventh schematic diagram showing a forming process of an active area according to an embodiment of the disclosure.
Figure 3L:
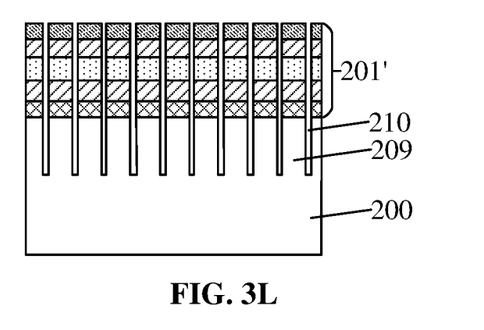
FIG. 3L is a twelfth schematic diagram showing a forming process of an active area according to an embodiment of the disclosure.
Figure 3M:
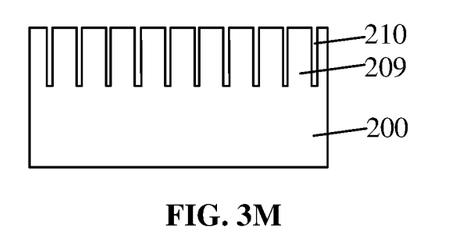
FIG. 3M is a thirteenth schematic diagram showing a forming process of an active area according to an embodiment of the disclosure.
Figure 3N:
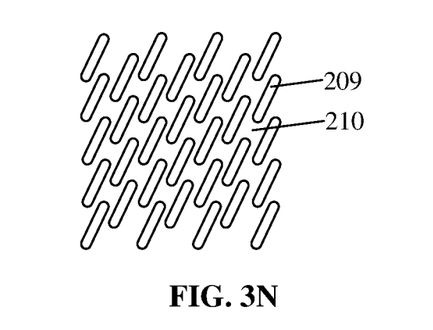
FIG. 3N is a fourteenth schematic diagram showing a forming process of an active area according to an embodiment of the disclosure.

FIG. 3A to FIG. 3N are schematic diagrams showing a forming process of the active area according to an embodiment of the disclosure. Next, the method for forming the active area provided by the embodiment of the disclosure is further described in detail with reference to FIG. 3A to FIG. 3N.

Firstly, S201 is performed, in which a semiconductor substrate is provided.

Next, with reference to FIG. 3A and FIG. 3B, S202 is performed, in which a first mask layer and a second mask layer are sequentially formed on a surface of the semiconductor substrate. The second mask layer has an initial pattern for forming the active area.

In some embodiments, the second mask layer may be formed by the following operations.

In S2021, a second initial mask layer and a patterned photoresist layer are sequentially formed on a surface of the first mask layer. The patterned photoresist layer has the initial pattern.

As shown in FIG. 3A, the first mask layer 201 is arranged on the surface of the semiconductor substrate 200. The first mask layer 201 in the embodiment of the disclosure includes a first layer of the first mask layer 201a, a second layer of the first mask layer 201b, a third layer of the first mask layer 201c, a fourth layer of the first mask layer 201d and a barrier layer 201e sequentially stacked on one another from bottom to top. The first layer of the first mask layer 201a may be a silicon oxide layer, the second layer of the first mask layer 201b and the fourth layer of the first mask layer 201d may be silicon nitride layers, the third layer of the first mask layer 201c may be a spin on carbon layer or a spin on hard mask layer, and the barrier layer 201e may be an Amorphous Silicon (Amorphous Si) layer. A second initial mask layer 202' is formed on the surface of the first mask layer 201, and a patterned photoresist layer 203 is formed on a surface of the second initial mask layer 202'. The photoresist layer 203 has an initial pattern B for forming the active area.

In the embodiment of the disclosure, the second initial mask layer 202' includes a first initial hard mask layer 202a', a second initial hard mask layer 202b' and an initial anti-reflection layer 202c' sequentially stacked on one another from bottom to top. The first initial hard mask layer 202a' may be a silicon oxide layer, the second initial hard mask layer 202b' may be a carbon layer, and the initial anti-reflection layer 202c' may be a silicon oxynitride layer.

In other embodiments, the first mask layer and the second mask layer may also be composed of other hard mask layers or other materials. In the embodiment of the disclosure, the compositions of the first mask layer and the second mask layer are not limited.

In S2022, the second initial mask layer is etched through the patterned photoresist layer, so as to obtain the second mask layer with the initial pattern.

As shown in FIG. 3B, the second initial mask layer 202' is etched through the patterned photoresist layer 203, so as to obtain the second mask layer 202 with the initial pattern B. The second mask layer 202 includes a first hard mask layer 202a, a second hard mask layer 202b and an anti-reflection layer 202c sequentially stacked on one another from bottom to top.

In some embodiments, with reference to FIG. 3B, after the second mask layer 202 is formed, the method for forming the active area further includes the following operation. The patterned photoresist layer 203 is removed. In the embodiment of the disclosure, the patterned photoresist layer 203 may be removed through a wet etching technology.

Next, with reference to FIG. 3C, S203 is performed, in which a sacrificial layer covering the second mask layer is formed.

In some embodiments, the initial pattern B in the second mask layer exposes a portion of the first mask layer. S203 may be implemented by the following operations. A sacrificial material is deposited on an exposed surface of the first mask layer and a surface of the second mask layer to form the sacrificial layer.

As shown in FIG. 3C, the sacrificial material is deposited on the exposed surface of the first mask layer 201 and the surface of the second mask layer 202, so as to form the sacrificial layer 204. In the embodiment of the disclosure, an etching selectivity ratio of the sacrificial material to the first mask layer 201 is greater than an etching selectivity ratio of the first hard mask layer 202a to the first mask layer 201, and the etching selectivity ratio of the sacrificial material to the first mask layer 201 is greater than an etching selectivity ratio of the second hard mask layer 202b to the first mask layer 201. That is to say, the sacrificial layer is easier to remove than the first hard mask layer 202a and the second hard mask layer 202b. In the embodiment of the disclosure, the sacrificial material may be Photoresist (PR).

Next, with reference to FIG. 3D and FIG. 3E, S204 is performed, in which the sacrificial layer and a portion of the second mask layer are removed, so as to form a third mask layer with a preset thickness.

In some embodiments, S204 may include the following operations.

In S2041, the sacrificial layer and the second mask layer are thinned, and the portion of the second mask layer is removed, so as to form the third mask layer with the preset thickness and the sacrificial layer with the preset thickness. The third mask layer has the initial pattern.

In the embodiment of the disclosure, a process of thinning the sacrificial layer and the second mask layer may be implemented through CMP processing, or may also be implemented through a specific etching process.

In some embodiments, S2041 may be implemented by the following operations. The sacrificial layer, the anti-reflection layer and the second hard mask layer are thinned, and a portion of second hard mask layer is remained, so as to form the third mask layer.

As shown in FIG. 3D, starting from the top surface of the sacrificial layer 204, the sacrificial layer 204, the anti-reflection layer 202c and the second hard mask layer 202b are thinned, so as to remove a portion of the sacrificial layer, the anti-reflection layer 202c and a portion of the second hard mask layer, and a portion of the second hard mask layer 202b is remained, so as to form the sacrificial layer 204' with a preset thickness h1 and the third mask layer 205. The preset thickness h1 is less than the initial thickness h0 of the second mask layer 202 (as shown in FIG. 3C).

In S2042, the sacrificial layer with the preset thickness is removed.

As shown in FIG. 3E, the sacrificial layer 204' with the preset thickness is removed. In the embodiment of the disclosure, the sacrificial layer with the preset thickness may be removed by using a wet etching technology. For example, the sacrificial layer with the preset thickness may be removed by etching with solutions such as sulfuric acid, nitric acid, or hydrofluoric acid.

It should be noted that in the embodiment of the disclosure, the second hard mask layer in the third mask layer will not be damaged in a process of removing the sacrificial layer with high etching selectivity ratio through the wet etching technology, so that the integrity of the third mask layer can be maintained, which is conducive to the subsequent etching process.

Finally, with reference to FIG. 3F to 3N, S205 is performed, in which the active area is formed through the third mask layer and the first mask layer.

In some embodiments, the initial pattern in the third mask layer exposes a portion of the first mask layer. S205 may include the following operations.

In S2051, a spacer material layer is formed on an exposed surface of the first mask layer and a surface of the third mask layer.

In the embodiment of the disclosure, the spacer material layer includes a first spacer material layer and a second spacer material layer. The spacer material layer is configured to increase the pattern density of the initial pattern. S2051 may include the following operations.

In S10, a first spacer material is deposited on a top portion and sidewalls of the third mask layer and the exposed surface of the first mask layer, so as to form the first spacer material layer.

In the embodiment of the disclosure, the first spacer material layer may be formed by any suitable deposition process, and the second spacer material layer may be an oxide layer, such as a silicon oxide layer.

As shown in FIG. 3F, the first spacer material is deposited on the top portion and sidewalls of the third mask layer 205 and the exposed surface of the first mask layer 201, so as to form the first spacer material layer 206.

In the embodiment of the disclosure, the thickness of the third mask layer is lower than that of the second mask layer, so that the pattern of the first spacer material layer deposited on the sidewalls of the third mask layer is easier to control and maintain, which better meets subsequent process requirements.

In S11, a second spacer material is deposited on a surface of the first spacer material layer, so as to form the second spacer material layer.

The second spacer material layer is different from the first spacer material layer, and the second spacer material layer is easier to remove than the first spacer material layer. In the embodiment of the disclosure, the second spacer material layer may be a carbon layer.

As shown in FIG. 3G, the first spacer material is deposited on the surface of the first spacer material layer 206, so as to form the second spacer material layer 207.

In S2052, a portion of the spacer material layer and a portion of the third mask layer are removed, so as to form a fourth mask layer.

In some embodiments, the third mask layer includes the first hard mask layer and a portion of the second hard mask layer. S2052 may include the following operations.

In S12, the spacer material layer is planarized until a top surface of the second hard mask layer is exposed. A remaining portion of the first spacer material layer has a plurality of U-shaped structures. Each U-shaped structure is formed by two vertical spacers and a horizontal spacer.

As shown in FIG. 3H, the second spacer material layer 207 and the first spacer material layer 206 are planarized to remove a portion of the second spacer material layer 207 arranged on the top surface of the second hard mask layer 202b and a portion of the first spacer material layer 206 arranged on the top surface of the second hard mask layer 202b, so that the top surface of the second hard mask layer 202b is exposed, and a remaining portion of the second spacer material layer 207' and a remaining portion of the first spacer material layer are remained. The remaining portion of the first spacer material layer has a plurality of U-shaped structures. Each U-shaped structure is formed by two vertical spacers 206a and a horizontal spacer 206b.

In S13, the vertical spacers in the remaining portion of the first spacer material layer are removed.

In the embodiment of the disclosure, the vertical spacers in the remaining portion of the first spacer material layer may be removed by etching through a dry etching technology, such as a plasma etching technology.

As shown in FIG. 3I, the vertical spacers 206a in the remaining portion of the first spacer material layer are removed to expose the horizontal spacers 206b in the remaining portion of the first spacer material layer.

In S14, the second hard mask layer and a remaining portion of the second spacer material layer are removed to form the fourth mask layer.

In the embodiment of the disclosure, the second hard mask layer and the remaining portion of the second spacer material layer may be removed through a dry etching technology or a wet etching technology.

As shown in FIG. 3J, the second hard mask layer 202b and the remaining portion of the second spacer material layer 207' are removed to form the fourth mask layer 208. The fourth mask layer 208 is alternately composed of the first hard mask layer 202a and the horizontal spacers 206b in the remaining portion of the first spacer material layer. In the embodiment of the disclosure, the fourth mask layer 208 has a preset pattern C. The pattern density of the preset pattern C is greater than the pattern density of the initial pattern B. For example, the pattern density of the preset pattern C may be twice the pattern density of the initial pattern B.

In the embodiment of the disclosure, since the height of the third mask layer is reduced relative to the height of the second mask layer, a better pattern etching effect may be achieved during the formation of the fourth mask layer through the third mask layer, so that the curvature of the pattern is reduced, which facilitates controlling the critical dimension and maintaining the pattern integrity in the subsequent etching process.

In S2053, the active area is formed through the fourth mask layer and the first mask layer.

In some embodiments, S2053 may include the following operations.

In S15, the first mask layer is etched through the fourth mask layer, so as to transfer the preset pattern into the first mask layer to obtain a patterned first mask layer.

As shown in FIG. 3K, the first mask layer 201 is etched through the fourth mask layer 208 to obtain a patterned first mask layer 201', so as to transfer the preset pattern C into the first mask layer 201. The patterned first mask layer 201' includes a patterned first layer of the first mask layer 201a', a patterned second layer of the first mask layer 201b', a patterned third layer of the first mask layer 201c', a patterned fourth layer of the first mask layer 201d', and a patterned barrier layer 201e' sequentially stacked on one another from bottom to top.

In some embodiments, after forming the patterned first mask layer 201', the method for forming the active area further includes the following operation. The fourth mask layer 208 is removed.

In S16, the semiconductor substrate is etched through the patterned first mask layer, so as to form the active area.

As shown in FIG. 3L to FIG. 3N, the semiconductor substrate 200 is etched through the patterned first mask layer 201', so as to transfer the preset pattern C into the semiconductor substrate 200 to form the active areas 209 and shallow trench isolation 210 arranged between each two adjacent active areas.

In some embodiments, with reference to FIG. 3M and FIG. 3N, after the active area 209 is formed, the method for forming the active area further includes the following operation. The patterned first mask layer 201' is removed.

In the embodiment of the disclosure, the third mask layer with a relatively small thickness is obtained by processing the second mask layer with the initial pattern for forming the active area, so as to form the active area through the third mask layer, so that the shape of the pattern in the subsequent etching process can be easily controlled, which is conducive to the formation of the active area.

Figure 4:
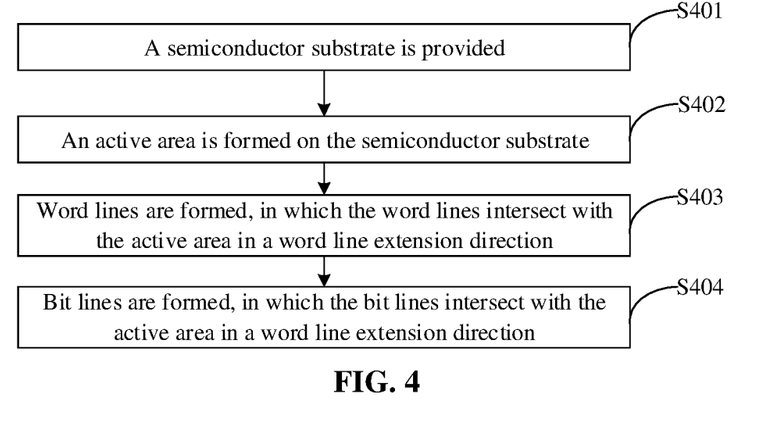
FIG. 4 is a schematic flowchart of a method for forming a semiconductor structure according to an embodiment of the disclosure.
Figure 5:
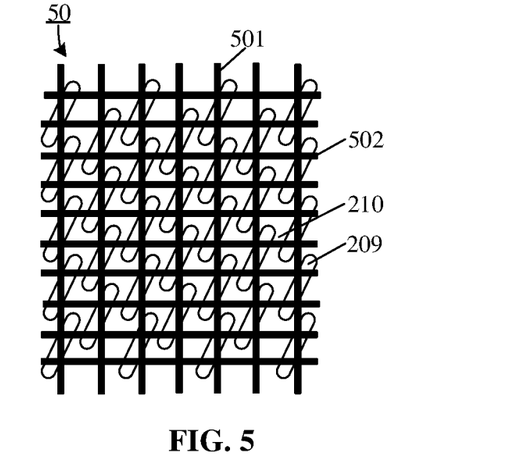
FIG. 5 is a top view of a semiconductor structure according to an embodiment of the disclosure.

In addition, the embodiment of the disclosure further provides a method for forming a semiconductor structure. FIG. 4 is a schematic flowchart of a method for forming a semiconductor structure according to an embodiment of the disclosure. FIG. 5 is a top view of a semiconductor structure according to an embodiment of the disclosure. The semiconductor structure 50 includes: active areas 209, shallow trench isolation 210 arranged between each two adjacent active areas, bit lines 501, and word lines 502. As shown in FIG. 4, the method for forming the semiconductor structure includes the following operations.

In S401, a semiconductor substrate is provided.

In the embodiment of the disclosure, the semiconductor substrate may be a silicon substrate. The semiconductor substrate may also include other semiconductor elements, such as germanium (Ge), or may include semiconductor compounds, such as silicon carbide (SiC), gallium arsenide (GaAs), gallium phosphide (GaP), indium phosphide (InP), indium arsenide (InAs) or indium antimonide (InSb), or may include other semiconductor alloys, such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP) and/or phosphorus gallium indium arsenide (GaInAsP), or a combination thereof.

In S402, the active area is formed on the semiconductor substrate.

In the embodiment of the disclosure, the active areas 209 may be formed on the semiconductor substrate by the above-mentioned method for forming the active area provided by the embodiment of the disclosure, which is not described in detail herein.

In S403, word lines are formed. The word lines intersect with the active area in a word line extension direction.

In S404, bit lines are formed. The bit lines intersect with the active area in a bit line extension direction.

In some embodiments, the active area 209 is configured to form a memory cell. The memory cell includes a transistor. The word line 502 is connected to the gate of the transistor. The word line 502 is configured to provide a word line voltage and control the transistor to be turned on or turned off through the word line voltage. The bit line 501 is connected to the source or the drain of the transistor. The bit line 501 is configured to perform a reading or writing operation on the memory cell when the transistor is turned on.

In the embodiment of the disclosure, the word line 502 or the bit line 501 is formed by forming metal wires at preset word line positions or preset bit line positions. The metal wires include, but are not limited to, tungsten (W), cobalt (CO), copper (Cu), aluminum (Al), polycrystalline silicon, titanium nitride, doped silicon, silicide, or any combination thereof.

In some embodiments, the semiconductor structure 50 may further include a storage capacitor. Correspondingly, the method for forming the semiconductor structure further includes the following operation. A storage capacitor is formed on a surface of the active area. One end of the storage capacitor is connected to the drain or the source of the transistor, and the other end of the storage capacitor is grounded. The storage capacitor is configured to store the data written into the memory cell.

In other embodiments, the semiconductor structure 50 may further include an adjustable resistor. Correspondingly, the method for forming the semiconductor structure further includes the following operation. The adjustable resistor is formed. The adjustable resistor is connected between the bit line 501 and the source of the transistor. Alternatively, the adjustable resistor is connected between the bit line 501 and the drain of the transistor 401. The adjustable resistor is configured to adjust the state of the data stored in the memory cell through the bit line voltage provided by the bit lines 501.

The method for forming the semiconductor structure in the embodiment of the disclosure is similar to the method for forming the active area in the above-mentioned embodiment. The technical features not disclosed in detail in the embodiment of the disclosure refer to the above-mentioned embodiment for understanding, which will not be repeated herein.

According to the method for forming the semiconductor structure provided by the embodiment of the disclosure, since the etched pattern is easier to control and maintain during the formation of the active area in the semiconductor structure, the forming process of the active area is more precise, and the forming process of the semiconductor structure is in turn more controllable and efficient, which facilitates improving the performance of the formed semiconductor structure.

In the several embodiments provided in the disclosure, it should be understood that the disclosed device and method may be implemented in non-target manners. The described device embodiments are merely exemplary. For example, the unit division is merely logical function division and may be other division in an actual implementation. For example, a plurality of units or components may be combined or integrated into another system, or some features may be ignored or not performed. In addition, the displayed or discussed components may be coupled or directly coupled to each other.

The units described above as separate components may or may not be physically separated. Components presented as units may or may not be physical units, that is, may be located in one place or may be distributed over multiple network units. Part or all of these units may be selected according to practical requirements to achieve the objectives of the solutions of the embodiment.

The characteristics disclosed in several method or device embodiments provided in the disclosure may be freely combined without conflicts to obtain new method embodiments or device embodiments.

The above descriptions are merely some implementations of the embodiments of the disclosure, and are not intended to limit the protection scope of the embodiments of the disclosure. It is easy for those skilled in the art to convince modifications or substitutions within the technical scope disclosed in the embodiments of the disclosure. These modifications or substitutions are within the scope of the embodiments of the disclosure. Therefore, the protection scope of the embodiments of the disclosure is subject to the protection scope of the claims.

What is claimed is:

1. A method for forming an active area, comprising:
providing a semiconductor substrate;
sequentially forming a first mask layer and a second mask layer on a surface of the semiconductor substrate, wherein the second mask layer has an initial pattern for forming the active area;
forming a sacrificial layer covering the second mask layer;
removing the sacrificial layer and a portion of the second mask layer to form a third mask layer with a preset thickness, wherein the preset thickness is less than an initial thickness of the second mask layer; and
forming the active area through the third mask layer and the first mask layer;
wherein removing the sacrificial layer and the portion of the second mask layer to form the third mask layer with the preset thickness comprises:
thinning the sacrificial layer and the second mask layer and removing the portion of the second mask layer to form the third mask layer with the preset thickness and the sacrificial layer with the preset thickness, wherein the third mask layer has the initial pattern; and
removing the sacrificial layer with the preset thickness; wherein
the initial pattern in the third mask layer exposes a portion of the first mask layer; and
wherein forming the active area through the third mask layer and the first mask layer comprises:
forming a spacer material layer on a surface of the portion of the first mask layer exposed by the initial pattern in the third mask layer and a surface of the third mask layer;

removing a portion of the spacer material layer and a portion of the third mask layer to form a fourth mask layer; and forming the active area through the fourth mask layer and the first mask layer.

2. The method according to claim 1, wherein
the second mask layer comprises a first hard mask layer, a second hard mask layer and an anti-reflection layer sequentially stacked on one another from bottom to top; and wherein thinning the sacrificial layer and the second mask layer and removing the portion of the second mask layer to form the third mask layer with the preset thickness comprises:

thinning the sacrificial layer, the anti-reflection layer and the second hard mask layer, and remaining a portion of the second hard mask layer to form the third mask layer.

3. The method according to claim 1, wherein
forming the second mask layer comprises the following operations:
sequentially forming a second initial mask layer and a patterned photoresist layer on a surface of the first mask layer, wherein the patterned photoresist layer has the initial pattern; and
etching the second initial mask layer through the patterned photoresist layer to obtain the second mask layer with the initial pattern.

4. The method according to claim 3, further comprising:
removing the patterned photoresist layer after forming the second mask layer.

5. The method according to claim 2, wherein
the initial pattern in the second mask layer exposes a portion of the first mask layer; and
wherein forming the sacrificial layer covering the second mask layer comprises:
depositing a sacrificial material on a surface of the portion of the first mask layer exposed by the initial pattern in the second mask layer and a surface of the second mask layer to form the sacrificial layer.

6. The method according to claim 5, wherein
an etching selectivity ratio of the sacrificial material to the first mask layer is greater than an etching selectivity ratio of the first hard mask layer to the first mask layer, and the etching selectivity ratio of the sacrificial material to the first mask layer is greater than an etching selectivity ratio of the second hard mask layer to the first mask layer.

7. The method according to claim 1, wherein
the spacer material layer comprises a first spacer material layer and a second spacer material layer; and
wherein forming the spacer material layer on the surface of the portion of the first mask layer exposed by the initial pattern in the third mask layer and the surface of the third mask layer comprises:
depositing a first spacer material on a top portion and sidewalls of the third mask layer and the surface of the portion of the first mask layer exposed by the initial pattern in the third mask layer to form the first spacer material layer; and
depositing a second spacer material on a surface of the first spacer material layer to form the second spacer material layer.

8. The method according to claim 7, wherein
the third mask layer comprises the first hard mask layer and the portion of the second hard mask layer; and wherein removing the portion of the spacer material layer and the portion of the third mask layer to form the fourth mask layer comprises:
planarizing the spacer material layer until a top surface of the second hard mask layer is exposed, wherein a remaining portion of the first spacer material layer has a plurality of U-shaped structures, each U-shaped structure being formed by two vertical spacers and a horizontal spacer;
removing the vertical spacers in the remaining portion of the first spacer material layer; and
removing the second hard mask layer and a remaining portion of the second spacer material layer to form the fourth mask layer.

9. The method according to claim 8, wherein
the fourth mask layer has a preset pattern, and a pattern density of the preset pattern is greater than a pattern density of the initial pattern.

10. The method according to claim 1, wherein
forming the active area through the fourth mask layer and the first mask layer comprises:
etching the first mask layer through the fourth mask layer to transfer the preset pattern into the first mask layer to obtain a patterned first mask layer; and
etching the semiconductor substrate through the patterned first mask layer to form the active area.

11. The method according to claim 10, further comprising:
removing the fourth mask layer after forming the patterned first mask layer.

12. The method according to claim 11, further comprising:
removing the patterned first mask layer after forming the active area.

13. A method for forming a semiconductor structure, comprising:
providing a semiconductor substrate;
forming an active area on the semiconductor substrate;
forming word lines, wherein the word lines intersect with the active area in a word line extension direction; and
forming bit lines, wherein the bit lines intersect with the active area in a bit line extension direction,
wherein forming the active area on the semiconductor substrate comprises:
providing the semiconductor substrate;
sequentially forming a first mask layer and a second mask layer on a surface of the semiconductor substrate, wherein the second mask layer has an initial pattern for forming the active area;
forming a sacrificial layer covering the second mask layer;
removing the sacrificial layer and a portion of the second mask layer to form a third mask layer with a preset thickness, wherein the preset thickness is less than an initial thickness of the second mask layer; and
forming the active area through the third mask layer and the first mask layer;
wherein removing the sacrificial layer and the portion of the second mask layer to form the third mask layer with the preset thickness comprises:
thinning the sacrificial layer and the second mask layer and removing the portion of the second mask layer to form the third mask layer with the preset thickness and the sacrificial layer with the preset thickness, wherein the third mask layer has the initial pattern; and
removing the sacrificial layer with the preset thickness; wherein the initial pattern in the third mask layer exposes a portion of the first mask layer; and wherein forming the active area through the third mask layer and the first mask layer comprises:

forming a spacer material layer on a surface of the portion of the first mask layer exposed by the initial pattern in the third mask layer and a surface of the third mask layer;

removing a portion of the spacer material layer and a portion of the third mask layer to form a fourth mask layer; and forming the active area through the fourth mask layer and the first mask layer.

\* \* \* \* \*